US008693893B2

(12) United States Patent
Johnson et al.

(10) Patent No.: US 8,693,893 B2
(45) Date of Patent: Apr. 8, 2014

(54) PICOSECOND OPTICAL SWITCHING USING RF NON-LINEAR TRANSMISSION LINES

(75) Inventors: David M. S. Johnson, Somerville, MA (US); Jason M. Hogan, Palo Alto, CA (US); Sheng-wey Chiow, Palo Alto, CA (US); Mark A. Kasevich, Palo Alto, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 98 days.

(21) Appl. No.: 13/373,355

(22) Filed: Nov. 10, 2011

(65) Prior Publication Data
US 2012/0154894 A1    Jun. 21, 2012

Related U.S. Application Data

(60) Provisional application No. 61/456,811, filed on Nov. 12, 2010.

(51) Int. Cl.
*H04B 10/04* (2011.01)
*H04B 10/12* (2011.01)

(52) U.S. Cl.
USPC ............................. 398/198; 398/183; 398/188

(58) Field of Classification Search
USPC ............................. 398/35, 183, 185, 188, 198
See application file for complete search history.

(56) References Cited

U.S. PATENT DOCUMENTS

| 6,778,279 | B2 * | 8/2004 | Lange et al. | 356/483 |
|---|---|---|---|---|
| 6,826,208 | B1 | 11/2004 | Birk | |
| 7,046,867 | B2 * | 5/2006 | Bohnert et al. | 385/12 |
| 7,953,323 | B2 * | 5/2011 | Zarris | 398/47 |
| 7,974,542 | B2 * | 7/2011 | Kagawa | 398/188 |
| 2003/0035162 | A1 * | 2/2003 | Myers et al. | 359/110 |
| 2008/0044128 | A1 * | 2/2008 | Kish et al. | 385/14 |
| 2009/0041473 | A1 * | 2/2009 | Nishihara et al. | 398/188 |

OTHER PUBLICATIONS

Birk et al., "10 Gbit/s RZ pulses using an all-silicon nonlinear transmission line integrated circuit", 2000, pp. 248-250, Optical Fiber Communication Conference 1.
Rodwell et al., "Active and Nonlinear Wave Propagation Devices in Ultrafast Electronics and Optoelectronics", pp. 1037-1059, Proc. IEEE v82n7.

* cited by examiner

*Primary Examiner* — Dalzid Singh
(74) *Attorney, Agent, or Firm* — Lumen Patent Firm

(57) ABSTRACT

Optical phase modulators are disposed in separate arms of an optical interferometer for forming short optical pulses. The optical phase modulators are driven by signals from an electrical nonlinear transmission line (NLTL). A time delay (typically on the order of the NLTL fall time) is introduced between the NLTL signals in the two arms of the interferometer. With this arrangement, the interferometer provides short optical pulses at its output. In one experiment, 70 ps switching was demonstrated using discrete $LiNbO_3$ traveling wave electro-optic modulators and commercially available NLTLs capable of delivering a 35 ps falling edge. A preferable approach is to integrate the NLTLs with the phase modulators, to further improve bandwidth. This fast switch can be used for various applications, such as implementing an Optical Time Division Multiplexing (OTDM) network architecture, and providing arbitrary waveform generation (AWG) capability.

12 Claims, 6 Drawing Sheets

PICOSECOND OPTICAL SWITCHING USING RF NON-LINEAR TRANSMISSION LINES

CROSS REFERENCE TO RELATED APPLICATIONS

This application claims the benefit of U.S. provisional patent application 61/456,811, filed on Nov. 12, 2010, entitled "Picosecond optical switching using RF non-linear transmission lines", and hereby incorporated by reference in its entirety.

GOVERNMENT SPONSORSHIP

This invention was made with Government support under contract number N00244-09-1-0063 awarded by the Naval Postgraduate School and under contract number HDTRA1-09-1-0024 awarded by the Defense Threat Reduction Agency. The Government has certain rights in this invention.

FIELD OF THE INVENTION

This invention relates to production of short optical pulses.

BACKGROUND

To keep pace with the demand for digital content, optical data rates are being pushed toward 1 Tb/s. High speed Optical Time Division Multiplexing (OTDM) using a single wavelength is an attractive option to achieve these transmission speeds. OTDM requires fast optical switches and short pulse generators, and these elements have been implemented in various ways. Electro-optic and electroabsorptive modulators (EOMs and EAMs, respectively) can directly apply an electronic switching signal to an optical carrier. Alternatively, non-linear optical effects have been used to modulate a short clock pulse to implement an all-optical mux and demux at 160 Gb/s.

Some OTDM schemes use an interferometer as an intensity modulator by inducing a phase shift between the arms via some optical non-linear interaction (e.g., cross phase modulation). These require short (~1 ps) optical gate pulses, typically generated by mode-locked laser diodes. These schemes are either complicated, or have not been shown to be capable of sub-ps switching speeds.

Another approach is described in U.S. Pat. No. 6,826,208, where a nonlinear transmission line (NLTL) is integrated with a pulse-forming circuit. In a nonlinear transmission line, an electronic signal experiences an amplitude-dependent propagation speed that causes an input sinusoidal wave with period T to steepen as it propagates to provide a sawtooth wave output having a sharp falling edge. The pulse forming network effectively differentiates the sawtooth wave to provide short pulses in the electrical domain. Short optical pulses can be obtained by providing these electrical pulses to the electrical input of an optical modulator. However, the pulse forming circuit required by this approach can impose a significant bandwidth limitation.

Accordingly, it would be an advance in the art to provide an approach for forming optical pulses that avoids this bandwidth limitation.

SUMMARY

In this work, optical phase modulators are disposed in separate arms of an optical interferometer for forming short optical pulses. The optical phase modulators are driven by signals from an electrical nonlinear transmission line (NLTL). As indicated above, the NLTL signals are sawtooth waves with sharp falling edges. A time delay (typically on the order of the NLTL fall time) is introduced between the NLTL signals in the two arms of the interferometer. With this arrangement, the interferometer provides short optical pulses at its output. In one experiment, 70 ps switching was demonstrated using discrete $LiNbO_3$ traveling wave electro-optic modulators and commercially available NLTLs capable of delivering a 35 ps falling edge. A preferable approach is to integrate the NLTLs with the phase modulators, to further improve bandwidth. This fast switch can be used for various applications, such as implementing an Optical Time Division Multiplexing (OTDM) network architecture, and providing arbitrary waveform generation (AWG) capability.

This switching scheme is simple and robust, has the potential to be competitive with current technology, and could conceivably support a Tb/s OTDM network. An NLTL can passively generate the THz-level harmonic content needed for sub-ps switching, and as a result we do not need a fast control pulse (as is needed in some of the conventional approaches mentioned above).

DETAILED DESCRIPTION

A) General Principles

Figure 1A:
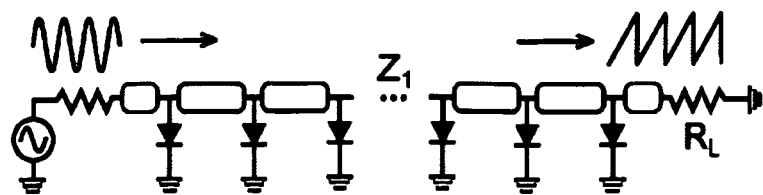
FIG. 1a shows a typical circuit schematic of a nonlinear transmission line.

In a nonlinear transmission line, an electronic signal experiences an amplitude-dependent propagation speed that causes an input signal with characteristic duration T (e.g., a sinusoidal wave with period T, or a pulse of duration T) to steepen as it propagates. An NLTL circuit diagram is given in FIG. 1a. The NLTL has a transmission line with impedance $Z_1$, periodically loaded with reverse-biased Schottky varactor diodes. $R_L$ is the terminating load resistance. NLTL design and performance characteristics are well known in the art (e.g., as described by Rodwell et al., "Active and Nonlinear Wave Propagation Devices in Ultrafast Electronics and Optoelectronics", Proc. IEEE v82n7 1994, pp 1037-1059, hereby incorporated by reference in its entirety).

Figure 1B:
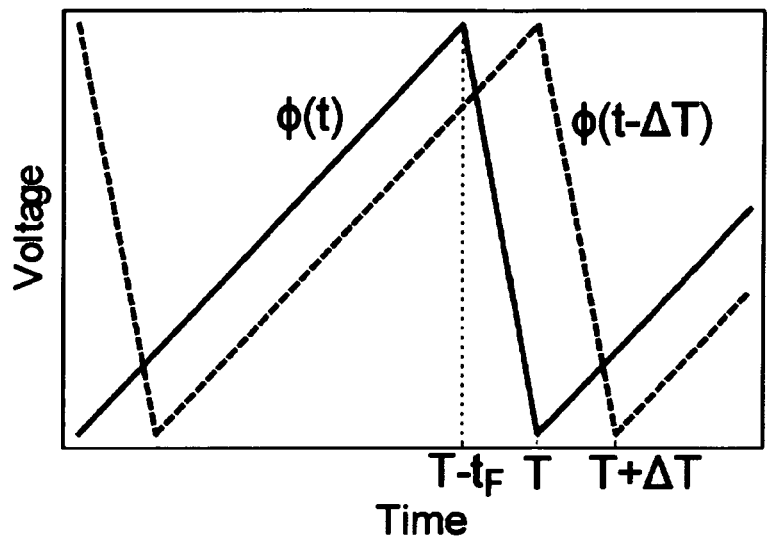
FIG. 1b shows the effect of a relative time delay between two optical phase modulations provided by a nonlinear transmission line.

The output of a sinusoidally driven NLTL approximates a sawtooth wave that periodically grows linearly for a time $(T-t_F)$ and then returns to zero in a short fall time $t_F$ at the end of each cycle as shown in FIG. 1b. To make a fast switch we optically subtract two sawtooth waves separated by a time $\Delta T$.

Figure 1C:
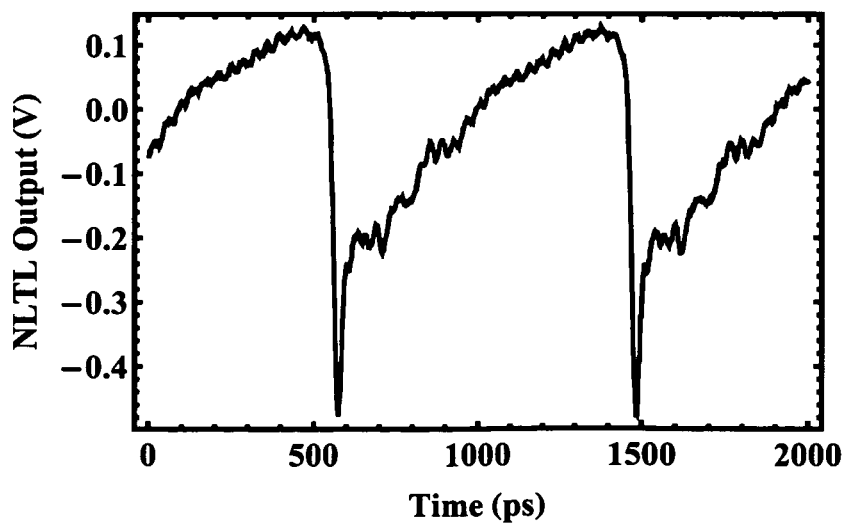
FIG. 1c shows an example of measured nonlinear transmission line output resulting from a sinusoidal input.

Commercially available NLTLs can have fall times in the picosecond range, as shown in FIG. 1c, which are necessary for sawtooth generation in the GHz range. The example of FIG. 1c shows the output of a Picosecond Pulse Labs 7113-110 NLTL driven with a 1.1 GHz sinewave. The measured fall time is 25 ps. When a sawtooth signal is used to drive an electro-optic phase modulator, the short fall time is imprinted on the light as a phase shift φ(t) provided that the modulator RF bandwidth is larger than $\sim t_F^{-1}$.

Figure 2A:
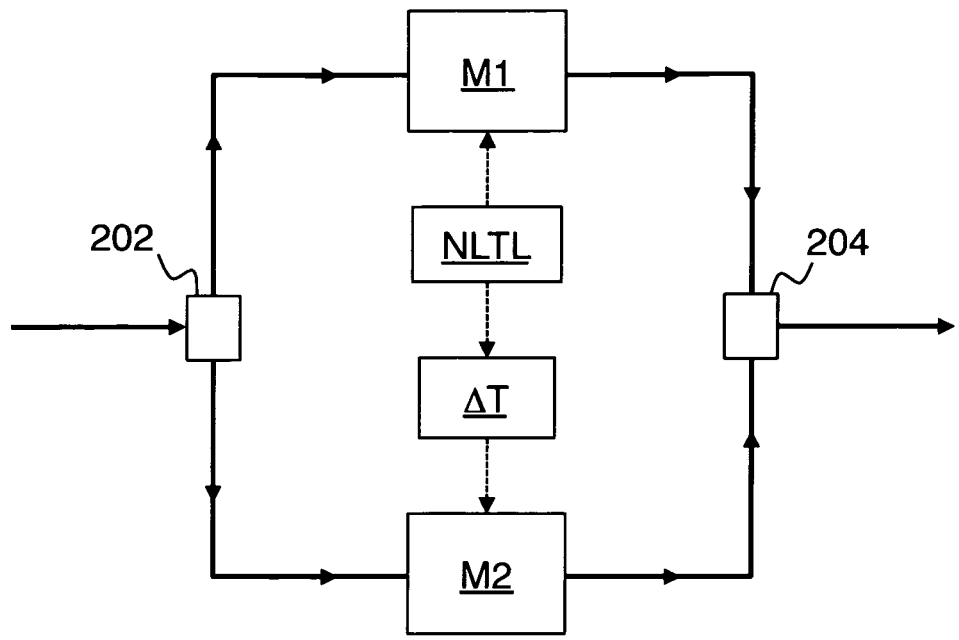
FIGS. 2a-b show exemplary block diagrams relating to embodiments of the invention.

In order to implement an optical switch, we apply NLTL-generated phase shifts to both arms of an interferometer using two independent phase modulators M1 and M2. FIG. 2a shows a first exemplary block diagram of this approach, where the interferometer is shown with a generic split block 202 and a generic combine block 204. As is well-known in the art, various optical configurations can provide this generic splitting and combining capability, and practice of the invention does not depend critically on the details of the interferometer configuration. Below, examples relating to Mach-Zehnder and Sagnac interferometers are given.

The interferometer output depends on the phase difference between the two arms given by $$\delta\theta = \phi(t-\Delta T) - \phi(t) + \delta\theta_0 \quad (1)$$

where ΔT is an added time delay between the drive signals, as shown in FIGS. 1b and 2a, and $\delta\theta_0$ is any (slowly varying) phase difference not induced by the modulators. The intensity at the output port is then proportional to $\sin^2(\delta\theta/2)$. For ΔT=0, the φ(t) signals are temporally overlapped and cause no phase shift. Choosing $\Delta T = t_F$ results in a narrow window of time $2t_F$ at the end of each sawtooth period during which the two waveforms do not cancel, leading to a rapid variation in δθ. The output intensity of the interferometer then depends on $\delta\theta_0$. Setting $\delta\theta_0 = 0$ gives a dark port condition for all times except during the interval $2t_F$ when light can emerge as a short pulse.

For generating sawtooth waveforms, NLTLs offer several advantages compared to their alternative, Step Recovery Diodes (SRDs), as they have lower phase noise and shorter fall times. Commercially available NLTLs with input frequencies above 2 GHz can generate harmonic content out to 50 GHz. A laboratory NLTL with an input frequency of 16 GHz demonstrated a fall time of 480 fs, corresponding to a ~1 THz bandwidth. In contrast, SRDs have demonstrated 12 ps fall times with significantly reduced harmonic content at high frequencies.

As indicated above, NLTLs have been used in the art for optical pulse generation. More specifically, the output of a silicon-based NLTL driven at 10 GHz followed by a pulse forming network (PFN) was applied to a LiNbO$_3$ modulator by Birk et al. (Optical Fiber Communication Conference 1, pp 248-250, 2000). The PFN is tuned to act as an electronic differentiator to convert the sawtooth NLTL output into a short pulse. Since our switch operates by subtracting two sawtooth modulation signals optically rather than differentiating the NLTL output electronically, it avoids the need for a PFN and the bandwidth limits that it imposes.

NLTLs with fall times around 500 fs have already been realized in GaAs, and sub-300 fs fall times appear to be possible. EOMs have demonstrated sufficient bandwidth for Tb/s optical switching using free-space coupling. However, phase modulators are usually limited by their finite RF waveguide bandwidth, which typically can be no greater than 100-200 GHz due to the dielectric loss tangent or electrode surface resistance.

Figure 2B:
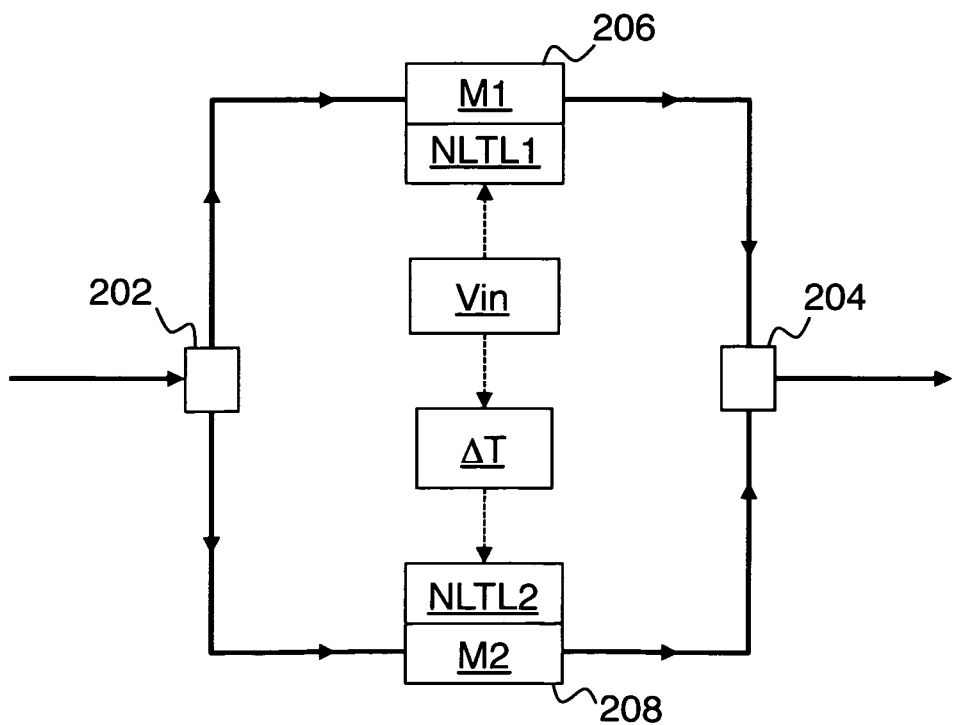

These RF coupling losses can be mitigated by integrating an NLTL into a traveling-wave modulator instead of putting them in series. FIG. 2b shows an exemplary block diagram for this approach. Here an integrated NLTL/modulator assembly 206 includes NLTL1 and M1 in a single device. Similarly, integrated NLTL/modulator assembly 208 includes NLTL2 and M2 in a single device. This could be accomplished by periodically loading the modulator waveguide with Schottky diodes. If the modulator's RF waveguide acts as an NLTL in the region where the light and RF co-propagate, then the rapidly falling edge that develops on the RF signal will be directly imprinted on the light, avoiding any coupling loss. This could allow for sub-ps phase modulation features that would enable Tb/s optical switching. For example, we consider a GaAs-based integrated NLTL/EOM. Note that the performance of GaAs traveling wave EOMs is comparable to LiNbO$_3$ modulators, and waveguide dimensions and doping profiles of GaAs modulators are very similar to state-of-the-art NLTL designs.

With this integrated approach, the above-described time delay ΔT can be provided by introducing a corresponding time delay ΔT between the input signals to NLTL1 and NLTL2. In the example of FIG. 2b, the NLTL input signals are derived from a source Vin, with a relative time delay of ΔT.

Thus, in general terms, embodiments of the invention have an optical interferometer where two or more phase modulators are disposed in the interferometer. One or more nonlinear transmission lines provide one or more electrical NLTL signals in response to electrical inputs having a characteristic duration T. The electrical NLTL signals have a fall time $t_F$. In one implementation, the input signal to the NLTL is periodic with period T, but non-periodic input signals (e.g., isolated pulses with duration T) also result in output signals having a fall time $t_F$. The optical phase modulators and nonlinear transmission lines are operatively coupled to each other such that optical radiation in the optical interferometer undergoes phase modulation according to the electrical NLTL signals. The phase modulation provided by the two or more optical phase modulators has a predetermined and non-zero relative time delay The optical phase modulators can be monolithically integrated with the nonlinear transmission lines to provide integrated NLTL/modulator assemblies (FIG. 2b). In this case, the time delay of the optical phase modulation can be provided by a corresponding predetermined and non-zero relative time difference between the electrical inputs provided to the integrated NLTL/modulator assemblies (e.g., ΔT on FIG. 2b). For the special case of periodic inputs to the NLTL/modulator assemblies, a phase difference of the electrical inputs can provide the above-described time difference. In general, time difference and phase difference are equivalent concepts for periodic signals.

A single NLTL can provide electrical NLTL signals to the two or more optical phase modulators (FIG. 2a). In this case, the time delay of the optical phase modulation can be provided by a corresponding predetermined and non-zero relative time difference between the electrical NLTL signals provided to the optical phase modulators (e.g., ΔT on FIG. 2a).

Preferably, the time delay of the phase modulation is approximately equal to the fall time $t_F$. It is also preferred for $T/t_F$ to be greater than about 50. Another preferred feature is a fall time $t_F$ of less than about 1 ns.

In the following specific examples, the input signals to the NLTL are sinusoidal. This is not necessary in practice, since NLTLs tend to produce sharp falling edges for any input signal. Thus, periodic signals other than sinusoids can also be used as the NLTL input. Non-periodic signals can also be used as the NLTL input (e.g., a digital data stream, isolated pulses etc.).

B) Experimental Results

Figure 3A:
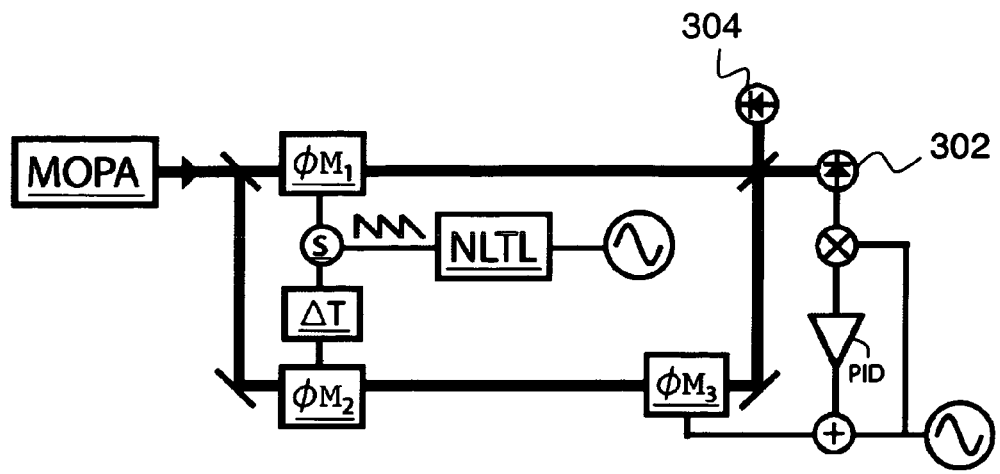
FIG. 3a shows an experimental setup relating to use of the invention in connection with a Mach-Zehnder interferometer.
Figure 3B:
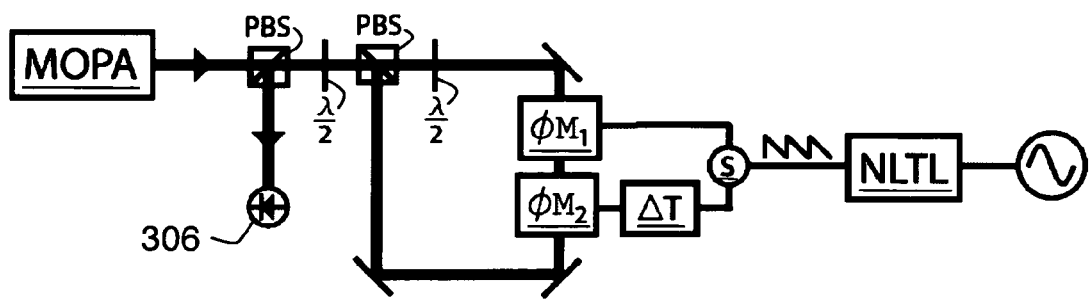
FIG. 3b shows an experimental setup relating to use of the invention in connection with a Sagnac interferometer.

We demonstrate the switching mechanism using discrete, commercially available GaAs NLTLs driving LiNbO$_3$ traveling wave EOMs. We built optical switches based on both Mach-Zehnder and Sagnac interferometer geometries (FIGS. 3a and 3b, respectively). On these figures, PBS refers to a polarizing beam-splitter, and λ/2 refers to a half waveplate.

For the Mach-Zehnder interferometer of FIG. 3a, each arm contains a phase modulator ($\phi M_1$, $\phi M_2$). An additional phase modulator $\phi M_3$ applies PID feedback to actively stabilize the interferometer. The sawtooth RF signal from the NLTL is split (S) and then goes through a delay line ΔT. The Mach-Zehnder interferometer (MZI) has the advantage that both its output ports 302 and 304 are accessible. Therefore the MZI can be used as a directional switch allowing input light to transfer to either of its output ports. However, the spatially separated arms of the Mach-Zehnder make the interferometer sensitive to uncontrolled drifts in the optical phase $\delta\theta_0$ and so it must be actively stabilized.

For the Sagnac interferometer of FIG. 3b, the two phase modulators are connected back-to-back with a fiber-fiber coupler to form a Sagnac loop. The symmetry of the Sagnac loop allows for stable operation without active feedback. The Sagnac interferometer geometry is intrinsically insensitive to drifts in $\delta\theta_0$ since all optical elements are common to both arms. Furthermore the output port 306 of the Sagnac is naturally dark. Since the Sagnac interferometer only has one output port 306 distinct from its input, it acts as a toggle switch. If both ports are required in a Sagnac configuration, a non-reciprocal element (e.g., an optical isolator) can be used to access the other port.

We demonstrate these two switches using a sinusoidal RF drive to create an optical pulse train from a CW laser source. The pulse spacing is then given by the period T of the input RF signal and the pulse width is determined by the time delay ΔT.

B1) Mach-Zehnder Switch

For the MZI switch, we generate the sawtooth waveform with a commercially available NLTL (Picosecond Pulse Labs 7102-110) driven with a 450 MHz RF signal at 26 dBm from an amplified (Mini-Circuits ZHL-1W) function generator. This drive signal is well within the 700 MHz maximum input frequency of the NLTL. We divide the NLTL output using a broadband power splitter (Mini-Circuits ZN2PD2-50), send one signal through a tunable RF delay line (ARRA 6425E High Resolution Phase Shifter), and then apply the two resulting 20 dBm sawtooth waves to separate fiber phase modulators (Photline Technologies NIR-MPX850-LN08, >8 GHz bandwidth).

For the input light, we use a 780 nm narrow-linewidth (500 kHz) MOPA laser setup (New Focus Vortex injecting an Eagleyard tapered amplifier). A small fraction of the light (25 mW) is coupled into each fiber phase modulator and the outputs are then overlapped and interfered on a beam splitter. We detect the intensity modulated light at the dark port of the interferometer using a 25 GHz photodiode (New Focus 1431 VIS-IR).

Mechanical and thermal noise cause phase variations in $\delta\theta_0$. In order to remain at the dark port we actively stabilize the relative phase between the two arms using a dither lock. An additional phase modulator $\phi M_3$ in one interferometer arm serves as a feedback actuator. We generate the error signal by dithering $\phi M_3$ at 10 MHz with small modulation depth and then demodulating the bright port response at the dither frequency. This error signal is sent through a PID controller, combined with the dither signal using a bias-tee and applied to $\phi M_3$.

Figure 4A:
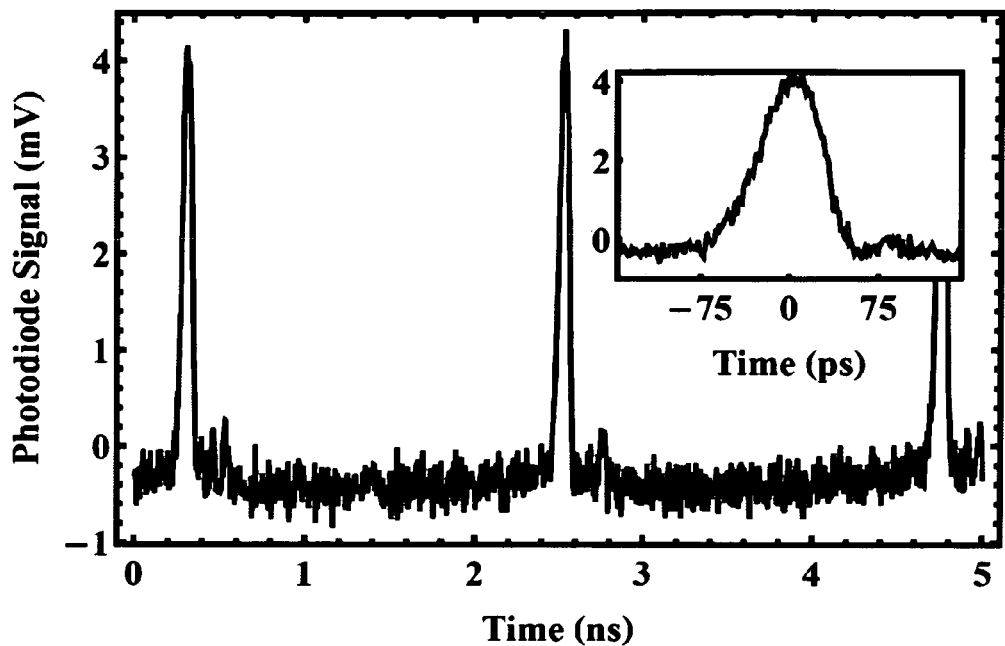
FIGS. 4a-b show experimental results from the experiment of FIG. 3a (Mach-Zehnder).
Figure 4B:
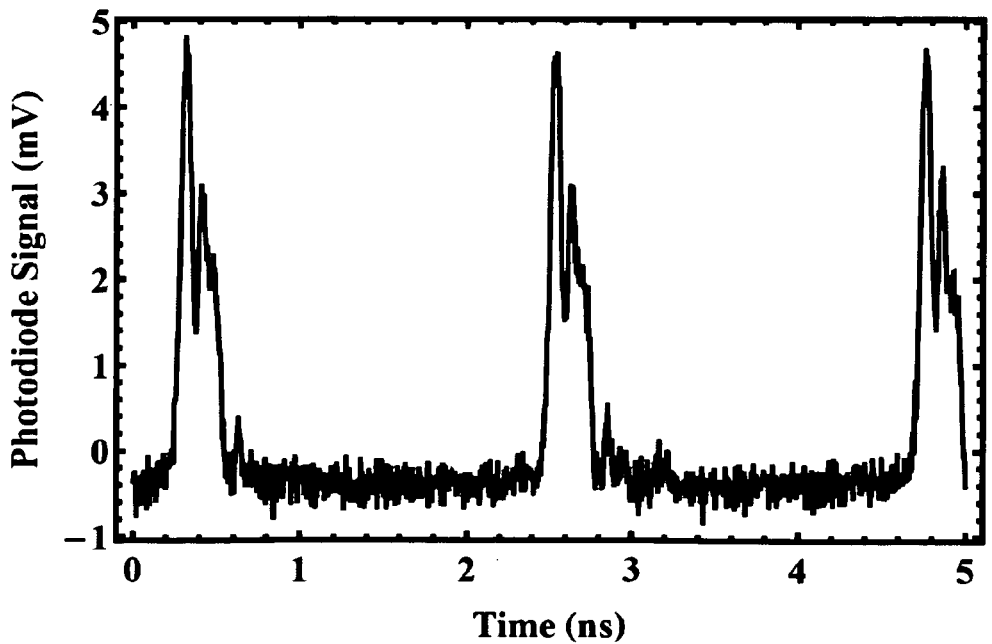

We measure the time domain photodiode signal of the stabilized MZI using a 63 GHz Agilent Infiniium DCA 86100B oscilloscope. By using the tunable RF delay line to optimize the time delay ΔT for short pulses, we obtained a 70 ps pulse train at a repetition rate of 450 MHz as shown in FIG. 4a. Here the data is averaged 64 times. Choosing ΔT correctly is important for generating short pulses. In FIG. 4b, the case where $\Delta T=\Delta T_{optimal}+130$ ps is shown. Not only are the resulting pulses longer (150 ps), they are also asymmetric due to ripple on the sawtooth time-domain waveform, as shown in FIG. 1c.

B2) Sagnac Switch

We built a Sagnac interferometer by placing two phase modulators back-to-back as shown in FIG. 3b. The Sagnac geometry relies on the direction-dependent modulation efficiency of the traveling wave EOMs to impart a differential phase shift to the counter-propagating arms. Since the modulators rely on phase velocity matching between the RF signal and light for efficient phase-modulation, $\phi M_1$ and $\phi M_2$ are arranged with opposite RF propagation directions so that each modulator predominately affects only one direction of the Sagnac loop. Still, even with this phase velocity mismatch, each modulator imprints an undesired phase shift on the non-phase velocity matched arm. However, the counter-propagating modulator is not efficient above the corner frequency $f_c=c/2\pi nL \approx 680$ MHz, and its modulation is completely suppressed whenever $f=\pi m f_c$ for positive integer m, where n is the index of refraction and L is the length of the electro-optic crystal. This allows for asymmetric RF modulation between the two directions.

Figure 5:
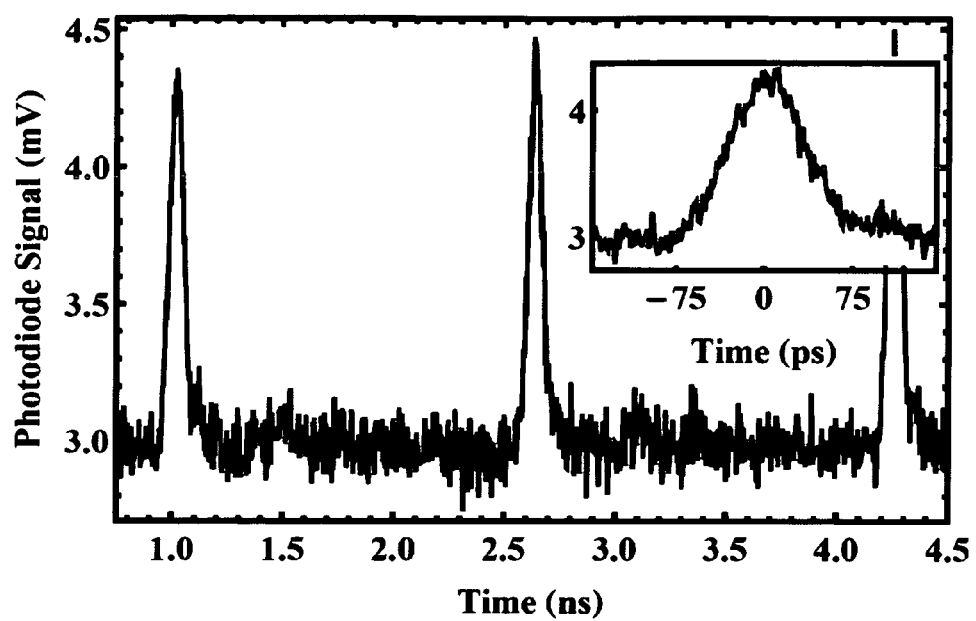
FIG. 5 shows experimental results from the experiment of FIG. 3b (Sagnac).

Again we used the tunable RF delay line to optimize the time delay ΔT and we adjusted the NLTL drive frequency for short pulses, obtaining a 100 ps pulse train at a repetition rate of 617.9 MHz as shown in FIG. 5. Here, the data is averaged 256 times. To avoid damage to the phase modulators, the light power in either direction of the Sagnac is less than in either arm of the MZI.

The power reduction in the Sagnac configuration is not fundamental and can conceivably be improved. In principle, a single phase modulator with RF propagating in both directions could reduce fiber coupling and insertion losses by up to ~3 dB. Appropriate choice of NLTL drive frequency and electro-optic crystal length can further suppress modulation crosstalk from the non-phase-velocity-matched direction.

B3) Conclusion

With appropriate RF control over the input to the NLTL, the switches demonstrated here can be incorporated into an OTDM system. Although the data shown in FIGS. 4 and 5 was taken using a continuous RF drive signal, in principle the switch only requires a single RF cycle to operate. The NLTL passively reduces the pulse length of the RF waveform from the initial period T to the fall time $t_F$. While we achieve $T/t_F=63$ at 450 MHz, NLTL time reductions as large as $T/t_F=130$ at 16 GHz have been demonstrated in the art. In an integrated NLTL/EOM switch as described above, this would allow the electronic data rate to be ~100 times slower than the optical data rate, allowing many ~10 Gb/s channels to be multiplexed into a Tb/s OTDM system.

C) Application Example

This approach for forming short optical pulses is generally applicable to any situation where short optical pulses may be useful or desired (e.g., optical time division multiplexing systems, etc.). Generally, practice of the invention does not depend critically on the application of the short optical pulses. The present approach provides short optical pulses with relatively modest electrical bandwidth requirements, which can have many surprising and unexpected applications. The following is one example of such an application, namely to arbitrary waveform generation.

Figure 6:
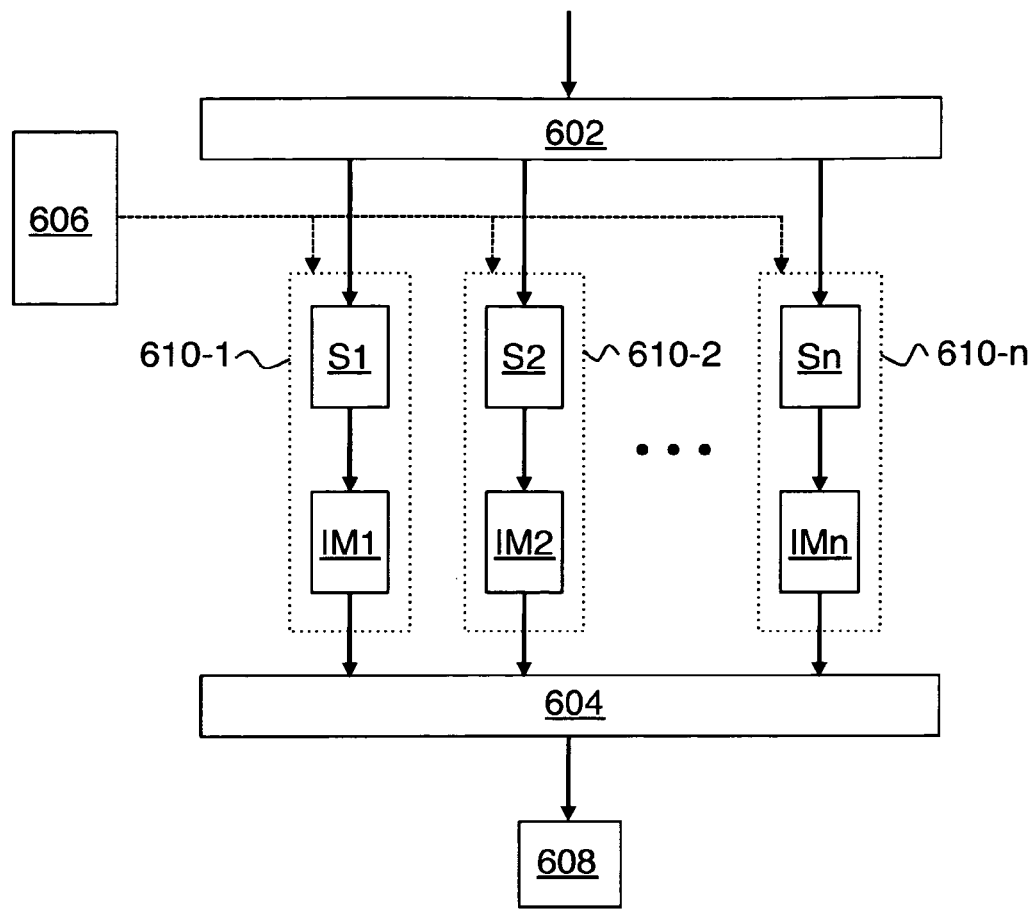
FIG. 6 shows an application of the present approach for providing optical and/or electrical arbitrary waveform generation.

FIG. 6 shows an approach for providing arbitrary waveform generation (AWG) according to the present principles. Here we have N optical channel units (610-1, 610-2, ..., 610-n). Each optical channel unit includes a corresponding switch S and intensity modulator IM. Thus unit 610-1 includes switch S1 and modulator IM1, etc. Each of the switches S1, S2, ..., Sn is a switch as described above (i.e., includes an interferometer with phase modulators driven by NLTL signals to provide short optical pulses). A beam splitting unit 602 is configured to split a single AWG input into N channel inputs to the channel units. A beam combining unit 604 is configured to combine the N channel unit outputs into a single AWG output. A controller 606 controls the switches and modulators of the channel units as described below.

As a result of this splitting and combining, the light is divided up into N distinct paths. The switches S1, S2, ... Sn are driven periodically in a cascaded fashion. Specifically, each switch is turned on for a time duration T/N during each time period T. The time delays between the switch signals are arranged so that only one switch is on at a given time. Each path also passes through its own intensity modulator (IM1, IM2, ... IMn). This may be for example an electro-optic modulator or a Mach-Zehnder modulator. The paths are then recombined (e.g., using beam splitters). The time delays between the paths are arranged so that the output light in each time interval of duration T/N originates from a different path. The light intensity during each time interval can then be individually controlled by the intensity modulator in the associated path. This allows time dependent intensity control of the light with a sampling rate of T/N. Notably, the electrical data rate required to control the intensity modulators in the N paths is then N times lower than the sampling rate of the AWG. The output optical signal from the AWG can optionally be converted to an electrical AWG signal using an optional photodetector 608.

The invention claimed is:

1. Apparatus comprising:
    an optical interferometer;
    two or more optical phase modulators disposed in the optical interferometer;
    one or more nonlinear transmission lines (NLTL) capable of providing one or more electrical NLTL signals in response to electrical input signals having a characteristic duration T, wherein the electrical NLTL signals have a fall time $t_F$;
    wherein the optical phase modulators and nonlinear transmission lines are operatively coupled to each other such that optical radiation in the optical interferometer undergoes phase modulation according to the electrical NLTL signals;
    wherein the phase modulation provided by the two or more optical phase modulators has a predetermined and non-zero relative time delay;
    wherein the one or more nonlinear transmission lines each include an electrical transmission line having an amplitude-dependent propagation speed for electrical signals.

2. The apparatus of claim 1, wherein each of the optical phase modulators is monolithically integrated with a corresponding one of the one or more nonlinear transmission lines to provide an integrated NLTL/modulator assembly.

3. The apparatus of claim 2, wherein the predetermined and non-zero relative time delay is provided by a corresponding predetermined and non-zero relative time difference between the electrical inputs provided to the integrated NLTL/modulator assemblies.

4. The apparatus of claim 1, wherein a single NLTL provides electrical NLTL signals to the two or more optical phase modulators, and wherein the predetermined and non-zero relative time delay is provided by a corresponding predetermined and non-zero relative time difference between the electrical NLTL signals provided to the optical phase modulators.

5. The apparatus of claim 1, wherein the predetermined and non-zero relative time delay is approximately equal to the fall time $t_F$.

6. The apparatus of claim 1, wherein $T/t_F$ is greater than about 50.

7. The apparatus of claim 1, wherein the fall time $t_F$ is less than about 1 ns.

8. The apparatus of claim 1, wherein the optical interferometer is a Sagnac interferometer.

9. The apparatus of claim 1, wherein the optical interferometer is a Mach-Zehnder interferometer.

10. The apparatus of claim 9, wherein the Mach-Zehnder interferometer is actively stabilized.

11. An arbitrary waveform generator (AWG) comprising:
    N optical channel units, wherein each of the optical channel units comprises an apparatus according to claim 1 in series with an optical intensity modulator, and wherein N≥1;
    a beam splitting unit configured to provide channel optical inputs to the optical channel units by splitting an optical input of the AWG;
    a beam combining unit configured to provide an optical output of the AWG by combining channel optical outputs of the optical channel units; and
    a controller configured to control the apparatus according to claim 1 in each of the optical channel units such that each time period having duration T is divided into N slots, and such that in each of the slots, a corresponding one of the optical channel units is the only optical channel unit that substantially contributes to the optical output of the AWG;
    wherein the controller is also configured to adjust an intensity of the optical output of the AWG by controlling the intensity modulators of the optical channel units;
    whereby an arbitrary optical waveform can be generated.

12. The arbitrary waveform generator of claim 11, further comprising a photodetector disposed to receive the optical output of the AWG, whereby an arbitrary electrical waveform can be generated.

* * * * *